United States Patent [19]
Pinney et al.

[11] Patent Number: 5,150,186
[45] Date of Patent: Sep. 22, 1992

[54] CMOS OUTPUT PULL-UP DRIVER

[75] Inventors: David Pinney, Boise, Id.; Gary Johnson, Austin, Tex.; Greg Roberts; Steve Casper, both of Boise, Id.

[73] Assignee: Micron Technology, Inc., Boise, Id.

[21] Appl. No.: 665,558

[22] Filed: Mar. 6, 1991

[51] Int. Cl.$^5$ .......................................... H01L 27/02
[52] U.S. Cl. ............................................................ 357/42
[58] Field of Search .................................. 357/42, 40

[56] References Cited

U.S. PATENT DOCUMENTS 5,023,688  6/1991  Ando et al. ........................... 357/42
5,117,274  5/1992  Mastroianni .......................... 357/42

Primary Examiner—John D. Lee
Assistant Examiner—Robert E. Wise
Attorney, Agent, or Firm—Wells, St. John & Roberts

[57] ABSTRACT

A CMOS integrated circuit output terminal driver subcircuit (60) provides quick response at an output terminal (56) of an integrated circuit (50) while preventing reverse current leakage when an external high voltage, which exceeds the positive internal circuit source voltage of the integrated circuit, is imposed on the output terminal (56). The output driver subcircuit (60) additionally provides an output voltage at the output terminal that is only nominally below the internal circuit source voltage. A p-channel MOS pull-up transistor (62) is operably connected to the output terminal (56) to selectively drive it substantially to the internal circuit source voltage. A leakage prevention device (66), comprising a native n-channel transistor (68) with a low turn-on threshold voltage, is connected in series with the pull-up transistor (62) to prevent output terminal reverse current leakage back through the pull-up transistor (62) when the external high voltage is imposed upon the output terminal (56).

26 Claims, 2 Drawing Sheets

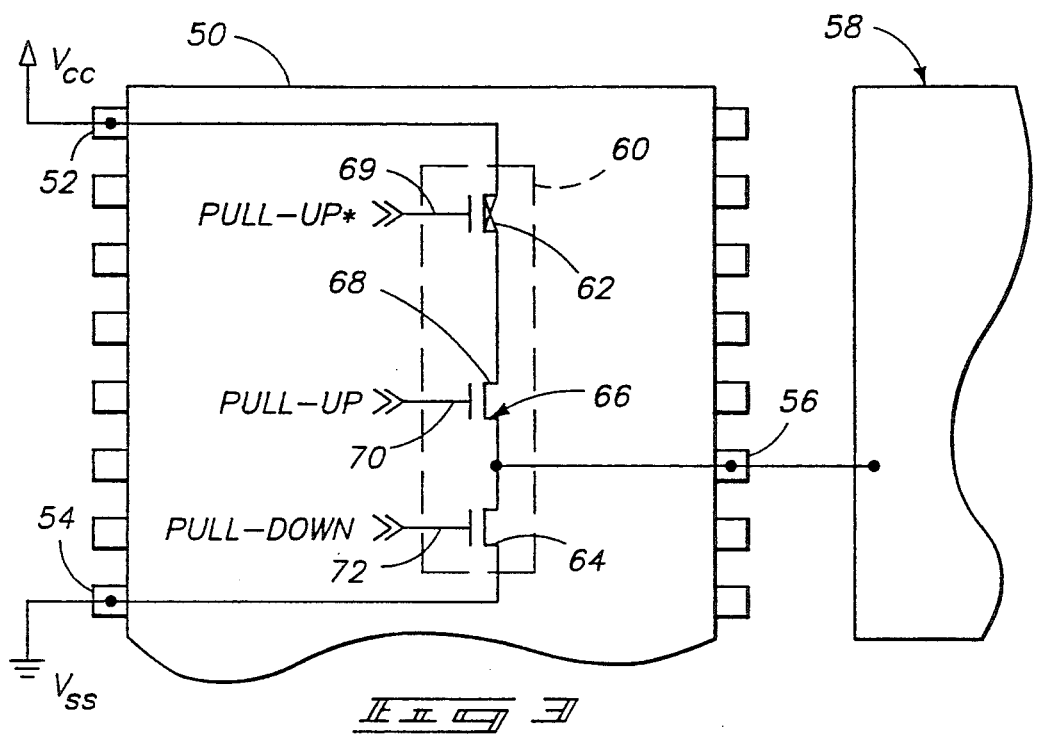
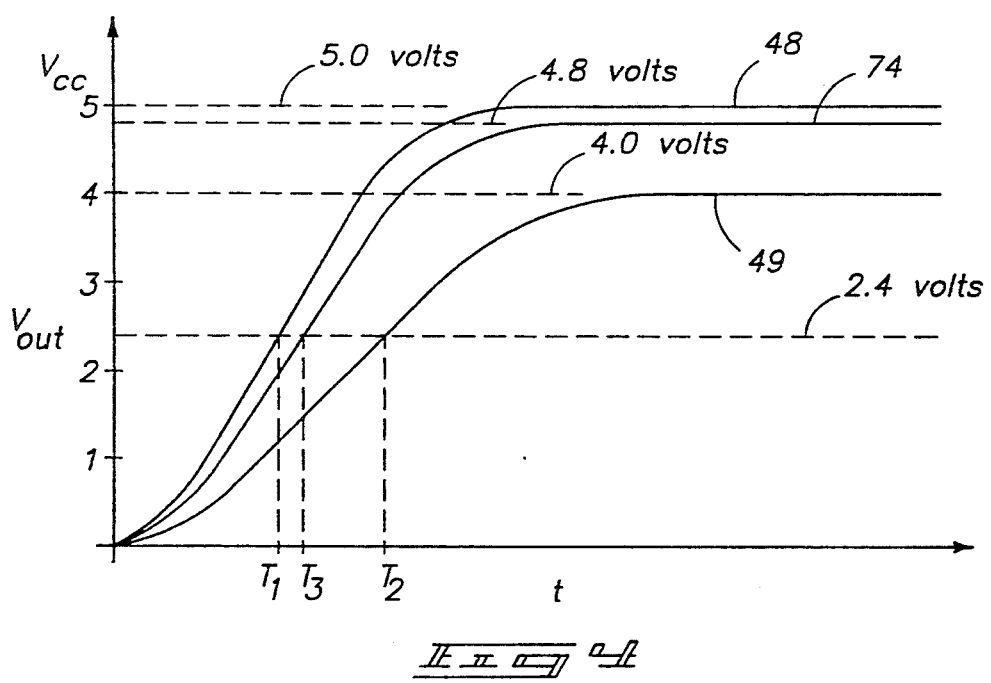

CMOS OUTPUT PULL-UP DRIVER

TECHNICAL FIELD

This invention relates to leakage prevention circuits for connection between a pull-up device and an output terminal of a CMOS integrated circuit output driver subcircuit.

BACKGROUND OF THE INVENTION

As a preliminary matter, this invention concerns circuits that use voltages to represent binary logic values. A particular circuit may use varying voltage levels within its various sub-circuits to represent the two binary logic values. Accordingly, the words "high" and "low" in this specification generally refer to voltages corresponding to true and false binary logic values, respectively, within a given sub-circuit. Where binary signal lines are designated by a signal name, a "*" following the designation indicates that the signal line carries a voltage corresponding to the logical complement of the named signal. These conventions will be used in the following discussion of the invention.

To better understand the present invention and to more fully appreciate its contribution, two prior art circuits are shown in FIGS. 1 and 2 respectively and discussed below.

FIG. 1 shows a portion of a prior art CMOS integrated circuit, generally designated by the reference numeral 10, which includes a conventional output stage or output driver subcircuit 12. Integrated circuit 10 includes a supply voltage terminal 14, a ground terminal 16, and an output terminal 18. Supply voltage terminal 14 is connected to a source of positive voltage $V_{cc}$ which is external to the integrated circuit. Similarly, ground terminal 16 is connected to an external ground source $V_{ss}$. An external circuit 20 is connected to output terminal 18. Output driver 12 is connected to output terminal 18 to transmit a digital signal to external circuit 20, through output terminal 18, to a high, low, or high impedance.

Output driver subcircuit 12 has a pull-up input line 22 that receives an input signal PULL-UP*. A pull-down input line 24 receives an input signal PULL-DOWN. These signals determine whether output driver 12 produces (1) a high, (2) a low, or (3) a high impedance at output terminal 18.

Such a conventional output driver 12 generally comprises a p-channel metal oxide semiconductor field effect transistor (MOSFET) pull-up device 26 and an n-channel MOSFET pull-down device 28. Pull-up transistor 26 has a source connected to a positive internal circuit source voltage, or $V_{cc}$, and a drain connected to output terminal 18. Pull-down transistor 28 has a source connected to ground, or $V_{ss}$, and a drain connected to output terminal 18. The gate of pull-up transistor 26 is connected to PULL-UP* through input line 22. The gate of pull-down transistor 28 is connected to PULL-DOWN through input line 24.

When PULL-UP* is active (low), p-channel pull-up transistor 26 conducts and drives output terminal 18 high. When PULL-DOWN is active (high), n-channel pull-down transistor 28 conducts and drives output terminal 18 low. If neither PULL-UP* or PULL-DOWN are active, neither pull-up transistor 26 or pull-down transistor 28 conducts. Accordingly, output driver 12 presents a high-impedance to output terminal 18 in this situation.

Such a conventional output driver subcircuit 12 is satisfactory for many applications. However, such a subcircuit has a significant limitation. Particularly, output terminals of certain integrated circuits are subjected to an external circuit voltage greater than $V_{cc}$ which allows significant output reverse leakage current back through output terminal 18 to the internal circuit. This is particularly undesirable for memory integrated circuits which are often connected to external circuits that are capable of generating excess voltages on output terminal 18. For instance, many dynamic and static random access memory integrated circuits specify no more than 10 μA leakage current. This specification must be met even when output terminal 18 reaches a specified excess voltage, such as $V_{cc}+1$.

Such a conventional output driver subcircuit 12 of FIG. 1 frequently permits a reverse current leakage in excess of 10 μA. One reason for this is the bidirectional capability of MOSFETs. Current flows from output terminal 18 back through pull-up transistor 26 as the voltage at output terminal 18 exceeds $V_{cc}$. If PULL-UP* is high, pull-up transistor 26 is normally reversed biased or off. However, pull-up transistor 26 becomes forward biased and allows reverse current leakage if the voltage at its drain exceeds the voltage at its gate by more than the transistor turn-on threshold voltage (generally less than 1.0 volt).

Reverse current leakage is also caused by forward biasing the p-n junction formed between the p-type drain and the n-type well of p-channel transistor 26. The n-wells of p-channel transistors are commonly biased to $V_{cc}$. Accordingly, a voltage at output terminal 18 which exceeds $V_{cc}$ by more than the turn-on voltage of a silicon p-n junction (typically 0.7 volts) will forward bias the p-n junction between the drain and n-well of transistor 26, allowing current from output terminal 18 to $V_{cc}$.

Thus, significant reverse leakage current through pull-up transistor 26 may occur whenever excess voltage from an external circuit is imposed upon output terminal 18, regardless of whether PULL-UP* is high or low.

FIG. 2 shows a second prior art output driver subcircuit within an integrated circuit 30. The second prior art output driver subcircuit is generally referenced by the numeral 32. Output driver 32 is similar to output driver 12 of FIG. 1 and includes an output terminal 34, a pull-up input line 36, a pull-down input line 38, and an n-channel MOSFET pull-down device 40. Output driver 32, however, has an n-channel MOSFET pull-up device 42, rather than the p-channel pull-up transistor 26 of FIG. 1. Pull-down input line 38 is connected to input signal PULL-DOWN. Pull-up input line 36 is connected to an active-high input signal PULL-UP rather than the active low signal of FIG. 1.

The source of pull-down transistor 40 is connected to $V_{ss}$ through a ground terminal 44. The drain of n-channel pull-up transistor 42 is connected to $V_{cc}$ through a supply voltage terminal 46. The drain of pull-down transistor 40 and the source of pull-up transistor 42 are connected in common to output terminal 34 which is, in turn, connected to an external circuit 47.

Output driver circuit 32 in operation is similar to output driver circuit 12 of FIG. 1, except for requiring an active-high signal at pull-up input line 36. An advantage of the second design is that the n-channel pull-up transistor 42 effectively prevents any reverse leakage current from output terminal 34. Specifically, when PULL-UP is low pull-up transistor 42 is off. Further, raising the voltage at output terminal 34 above $V_{cc}$ does not forward bias pull-up transistor 42. When PULL-UP is high, pull-up transistor 42 is on. However, an elevated voltage impressed on output terminal 34 reduces the gate to source voltage $V_{gs}$ of transistor 42. If the voltage or output terminal 34 exceeds $V_{cc}$, $V_{gs}$ is less than the turn-on threshold voltage $V_T$ of transistor 42. Accordingly, pull-up transistor 42 turns off, preventing reverse current leakage, as the voltage at output terminal 34 approaches or exceeds $V_{cc}$. Furthermore, by using an n-channel rather than a p-channel device, the drain to n-well p-n junction which allowed reverse current flow in output driver circuit 12 is eliminated.

However, while the second prior art output driver subcircuit 32 reduces or eliminates reverse current leakage, it creates other problems which are detrimental to the efficiency of many integrated circuits. The problems are created by the turn-on threshold voltage ($V_T$) of pull-up transistor 42. $V_T$ ranges from approximately 0.5 volts to 1.0 volt in typical CMOS circuits which utilize standard MOS transistors. For pull-up transistor 42 to conduct, it must maintain a voltage equal to or greater than $V_T$ between its gate and its source, or between pull-up input line 36 and output terminal 34. Accordingly, since PULL-UP can be at a voltage no greater than $V_{cc}$, the voltage at output terminal 34 cannot exceed $V_{cc} - V_T$. As the voltage at pull-up input line 36 approaches $V_{cc} - V_T$, therefore, pull-up transistor 42 begins to turn off. When the voltage at pull-up input line 36 reaches $V_{cc} - V_T$, pull-up transistor 42 is completely off.

Thus, the voltage to which output driver 32 can drive output terminal 34 is limited by the turn-on threshold voltage of pull-up transistor 42. Such a consequence is particularly undesirable when an integrated circuit is required to operate with a very low supply voltage. For instance, it is desirable in some cases to operate an integrated circuit at a circuit source voltage of as low as 3.0 volts. However, a high-logic output signal at output terminal 18 is specified to be no less than 2.4 volts. Achieving 2.4 volts at output terminal 18 with a circuit source voltage of 3.0 volts is either impossible or only marginally possible with standard n-channel transistors having turn-on threshold voltages of between 0.5 volts and 1.0 volts.

Even when operating at a more standard supply voltage such as 5.0 volts, use of an n-channel pull-up device 42 significantly slows output circuit operation. Output response time can be defined as the time required for an output terminal to reach an arbitrary voltage such as the minimum high-logic output voltage. FIG. 4 shows such output response times where the minimum high-logic output voltage is 2.4 volts. Line 48 shows the output voltage response with time of output driver 12, with a p-channel pull-up device. Line 49 shows the output voltage response with time of output driver 32, with an n-channel pull-up device. $T_1$ indicates the relative output response time of output driver 12 and $T_2$ indicates the relative output response time of output driver 32. Actual time responses depend on the impedances of external circuits 20 and 47, which are assumed to be equal. Only relative times are, therefore, shown. However, FIG. 4 reveals that the n-channel device of output driver 32 results in significantly slower output response time than does the p-channel pull-up device of output driver 12.

Consequently there remains a need for an output driver subcircuit which provides the comparatively quick response of a p-channel pull-up device while also providing the reverse output leakage prevention of an n-channel pull-up device. Furthermore, it is desirable for such a subcircuit to provide an output voltage at the output terminal which is nearly equal to $V_{cc}$.

BRIEF DESCRIPTION OF THE DRAWINGS

The preferred embodiment of the invention is illustrated in the accompanying drawings, in which:

FIG. 3 shows an electrical schematic diagrams of a preferred embodiment of an output driver subcircuit according to this invention; and FIG. 4 shows the output response, with time, of the output driver subcircuits of FIGS. 1, 2, and 3.

DETAILED DESCRIPTION OF THE PREFERRED EMBODIMENTS

Figure 1:
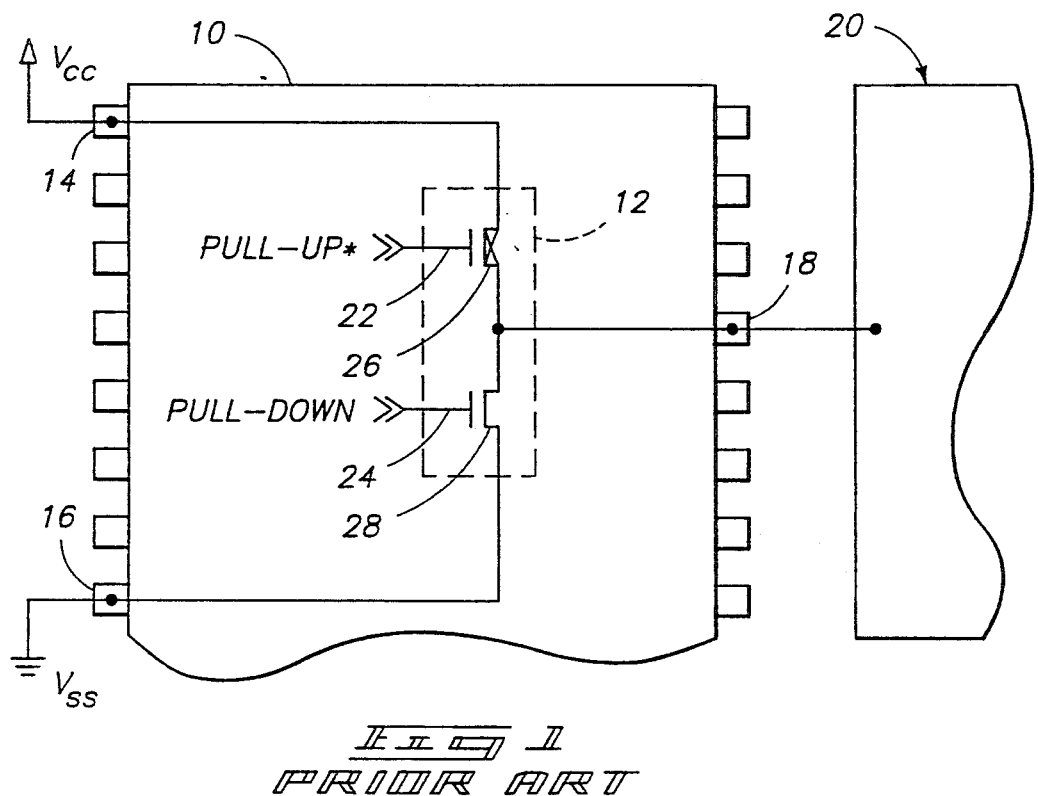
FIG. 1 shows an electrical schematic diagram of a first prior art output driver subcircuit.
Figure 2:
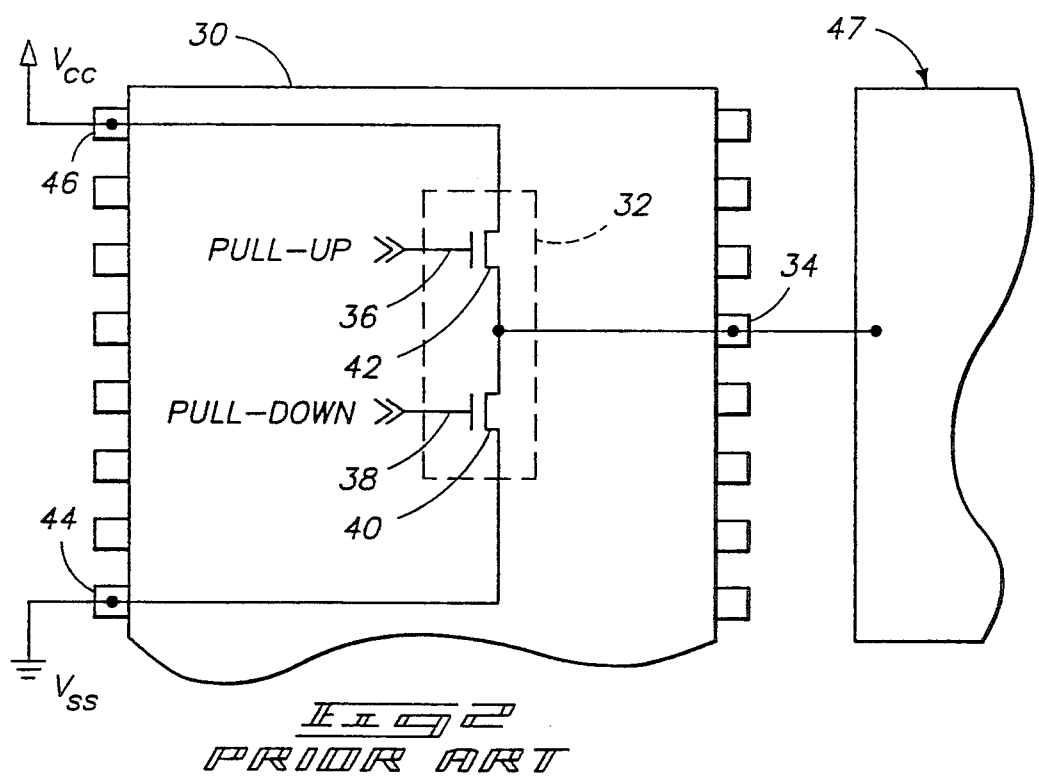
FIG. 2 shows an electrical schematic diagram of a second prior art output driver subcircuit.

The following disclosure of the invention is submitted in furtherance with the constitutional purpose of the Patent Laws "to promote the progress of science and useful arts" (Article 1, Section 8).

A preferred embodiment of a CMOS integrated circuit output stage or output driver subcircuit according to this invention is illustrated in FIG. 3. A portion of a CMOS integrated circuit is designated by the reference numeral 50. Integrated circuit 50, preferably a memory circuit, includes a supply voltage terminal 52, a ground terminal 54, and an output terminal 56. Supply voltage terminal 52 is connected to an source of positive voltage $V_{cc}$ which is external to the integrated circuit. Within integrated circuit 50, $V_{cc}$ forms a positive internal circuit source voltage. Similarly, ground terminal 54 is connected to an external ground source $V_{ss}$.

An external circuit 58 is connected to output terminal 56. External circuit 58 may be any circuit which is to be driven by output terminal 56. Additionally, because of the specific characteristics of the output driver of this invention, external circuit 58 can impose an external high voltage in excess of $V_{cc}$ upon output terminal 56 without causing output terminal leakage current back through output terminal 56.

Integrated circuit 50 includes an output stage or output driver subcircuit 60 connected to output terminal 56. Output driver 60 is to drive external circuit 58, through output terminal 56, to a high, low, or high impedance.

Output driver subcircuit 60 has a p-channel MOSFET pull-up device 62 and an n-channel MOSFET pull-down device 64. In addition, output driver subcircuit 60 has an output driver leakage prevention device 66 for preventing reverse leakage current from external circuit 58 back through pull-up transistor 62. Together, pull-up transistor 62 and leakage prevention device 66 form a pull-up circuit to selectively pull output terminal 56 to the internal circuit source voltage, $V_{cc}$.

Pull-up transistor 62 has its source connected to $V_{cc}$, and pull-down transistor 64 has its source connected to $V_{ss}$. The drain of pull-down transistor 64 is connected to output terminal 56.

Leakage prevention device 66 comprises a "native" n-channel MOSFET 68 with its drain connected to the drain of pull-up transistor 62 and its source connected to output terminal 56. The characteristics of a native n-channel MOSFET such as native transistor 68 will be described in more detail below.

Driver subcircuit 60 has a first pull-up input line 69 connected to the gate of pull-up transistor 62 that receives an input signal PULL-UP*. A second pull-up input line 70, connected to the gate of native transistor 68, receives an input signal PULL-UP. Output driver 60 also has a pull-down input line 72 connected to the gate of pull-down transistor 64 that receives an input signal PULL-DOWN. PULL-UP, PULL-UP*, and PULL-DOWN are produced by subcircuits (not shown) within integrated circuit 50 to signal output driver 60 to produce either (1) a high, (2) a low, or (3) a high impedance at output terminal 56. Input signals PULL-UP and PULL-UP* are complementary and signal output driver 60 to drive output terminal 56 high. Input signal PULL-DOWN signals output driver 60 to drive output terminal 56 low. If neither PULL-UP, PULL-UP*, or PULL-DOWN are active, output driver 60 presents a high impedance to output terminal 56.

In operation pull-down transistor 64 is selectively activated by PULL-DOWN to drive output terminal 56 substantially to ground. Similarly, pull-up transistor 62 and native transistor 68 are activated by PULL-UP and PULL-UP* to selectively drive output terminal 56 substantially to the internal circuit source voltage, $V_{cc}$.

When PULL-UP and PULL-UP* are active, pull-up transistor 62 is on and drives its drain fully to $V_{cc}$. Native transistor 68 is also on and conducts from its drain to its source. Since native transistor 68 is an n-channel device, it drops a voltage equal to its turn-on threshold voltage from its drain to its source. However, because it is a native transistor, its voltage drop is nominal.

When using common fabrication processes, MOS field effect transistors have an "original" or "native" turn-on threshold voltage. While the native turn-on threshold voltage is positive, it is only nominally so, typically being below 0.5 volts. More often, native threshold voltages are less than 0.2 volts or in the range of 0.1 volts to 0.2 volts. For various reasons larger threshold voltages are usually desired in conventional CMOS circuits. Therefore, threshold enhancement techniques such as ion implantation are often used to increase the turn-on threshold of MOS transistors.

Manufacturers of CMOS integrated circuits typically employ a threshold enhancement process such as ion implantation in a standard processing step to increase the turn-on voltage of MOS transistors to above 0.5 volts. However, "native" transistors-transistors with a native turn-on threshold voltage-may be preserved by masking selected transistors before ion implantation. Native transistors are, in fact, desired in certain applications within memory integrated circuits. Accordingly, a masking step to prevent ion implantation in selected transistors is standard in many memory integrated circuit fabrication processes.

Pull-up transistor 62 and pull-down transistor 64 are "standard" transistors with "standard" turn-on voltage thresholds produced by enhanced threshold processing such as ion implantation. However, leakage prevention transistor 68 is a native transistor, fabricated without enhanced threshold processing or substantial ion implantation. Accordingly, native transistor 68 has a low "native" turn-on threshold voltage which is significantly lower than the turn-on threshold voltage of standard MOSFETs in general and of pull-down transistor 64 in specific. It therefore produces only a low or nominal voltage drop between pull-up transistor 62 and output terminal 56.

Further, native transistor 68 prevents reverse leakage current when external circuit 58 impresses a high voltage on output terminal 56. For example, when PULL-UP is low, native transistor 68 is off. Raising the voltage at output terminal 56 above $V_{cc}$ does not forward bias native transistor 68. When PULL-UP is high, native transistor 68 is on. However, it turns off whenever the voltage from its gate to its source falls below $V_{Tn}$, i.e. whenever the voltage at output terminal 56 reaches $V_{cc} - V_{Tn}$ (assuming PULL-UP is at $V_{cc}$). Accordingly, native transistor 68 prevents reverse current flow from external circuit 58 back through pull-up transistor 62 even when external circuit 58 impresses a voltage on output terminal 56 in excess of $V_{cc}$.

Similarly, the source junction of native transistor 68 is a n-p junction. Since the p-type well region of transistor 68 is tied a voltage potential equal to or less than ground, the n-p junction will be reverse biased when output terminal 56 is at any positive voltage.

Referring now to FIG. 4, line 74 shows the comparative output response of output driver 60. $T_3$ shows the output response time—the time required to driver output terminal 56 to 2.4 volts. Driver 60 produces a final DC output level which is only nominally below $V_{cc}$. Furthermore, output response time $T_3$ is significantly shorter than $T_2$, the output response time of the prior art output driver circuit 30 which utilizes only a single, standard n-channel pull-up transistor. Furthermore, $T_3$ is only slightly longer than $T_1$, the output response time of the prior art output driver circuit 12 which utilizes only a p-channel pull-up transistor.

Accordingly, an output driver circuit is provided which provides the comparatively quick response time of a p-channel pull-up device while also provides the reverse output current leakage prevention of an n-channel device. In addition, output driver 60 provides a final DC output voltage at output terminal 56 which is only nominally below $V_{cc}$.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A CMOS integrated circuit output terminal driver comprising:
   an output terminal;
   a pull-up circuit connected to the output terminal, said pull-up circuit having
   (a) a p-channel MOS pull-up transistor, and
   (b) a native n-channel MOS transistor connected in series with the p-channel pull-up transistor, wherein the native n-channel transistor has a native turn-on threshold voltage.

2. The output terminal driver of claim 1, wherein the native n-channel transistor is fabricated without substantial ion implantation to maintain the native turn-on threshold voltage.

3. The output terminal driver of claim 1, wherein the native n-channel transistor is fabricated without subjecting the n-channel transistor to enhanced threshold processing.

4. The output terminal driver of claim 1, wherein the turn-on voltage of the native n-channel transistor is less than 0.5 volts.

5. The output terminal driver of claim 1, wherein the turn-on voltage of the native n-channel transistor is less than 0.2 volts.

6. The output terminal driver of claim 1, wherein the turn-on voltage of the native n-channel transistor is in the range of approximately 0.1 volts to 0.2 volts.

7. The output terminal driver of claim 1, wherein the turn-on voltage of the native n-channel transistor is lower than that of non-native n-channel transistors within the CMOS integrated circuit.

8. The output terminal driver of claim 1, further comprising a pull-down circuit having an n-channel pull-down transistor operably connected to selectively conduct between the output terminal and ground.

9. The output terminal driver of claim 1, further comprising a pull-down circuit having an n-channel pull-down transistor operably connected to selectively conduct between the output terminal and ground, wherein the turn-on threshold voltage of the native n-channel MOS transistor is lower than that of the n-channel pull-down transistor.

10. The output terminal driver of claim 1, wherein the native n-channel transistor is fabricated without increasing its turn-on threshold voltage from the original threshold voltage.

11. In a CMOS integrated circuit having an output terminal driver subcircuit for operative connection to an external circuit, the external circuit being capable of imposing an external high voltage upon the driver subcircuit, wherein the output terminal driver subcircuit comprises:
    an output terminal for connecting to the external circuit;
    a p-channel MOS pull-up transistor operably connected to the output terminal to selectively drive the output terminal substantially to an internal circuit source voltage;
    a native n-channel MOS transistor operably connected between the p-channel pull-up transistor and the output terminal to prevent output terminal current leakage back through the driver subcircuit when the external high voltage is imposed upon the output terminal.

12. In the CMOS integrated circuit of claim 11, wherein the native n-channel transistor produces a voltage drop in the range of 0.1 volts to 0.2 volts between the p-channel pull-up transistor and the output terminal when conducting.

13. In the CMOS integrated circuit of claim 11, wherein the native n-channel transistor produces a voltage drop of less than 0.5 volts between the p-channel pull-up transistor and the output terminal when conducting.

14. In the CMOS integrated circuit of claim 11, wherein the native n-channel transistor produces a voltage drop of less than 0.2 volts between the p-channel pull-up transistor and the output terminal when conducting.

15. In the CMOS integrated circuit of claim 11, wherein the native n-channel transistor has limited ion implantation to limit the voltage drop between the p-channel pull-up transistor and the output terminal when the native n-channel transistor is conducting.

16. In the CMOS integrated circuit of claim 11, wherein the native n-channel transistor is fabricated without subjecting it to threshold enhancement processing.

17. In the CMOS integrated circuit of claim 11, wherein the native n-channel transistor is fabricated without increasing its turn-on threshold voltage from the original threshold voltage.

18. In the CMOS integrated circuit of claim 11, wherein the native n-channel transistor has a turn-on voltage which is less than 0.5 volts to limit the voltage drop between the p-channel pull-up transistor and the output terminal when the native n-channel transistor is conducting.

19. In the CMOS integrated circuit of claim 11, wherein the native n-channel transistor has a turn-on voltage which is less than 0.2 volts to limit the voltage drop between the p-channel pull-up transistor and the output terminal when the native n-channel transistor is conducting.

20. In the CMOS integrated circuit of claim 11, wherein the native n-channel transistor has a turn-on voltage which is substantially in the range of 0.1 volts to 0.2 volts to limit the voltage drop between the p-channel pull-up transistor and the output terminal when the native n-channel transistor is conducting.

21. In the CMOS integrated circuit of claim 11, further comprising an n-channel pull-down transistor operably connected to the output terminal to selectively conduct between the output terminal and ground.

22. In the CMOS integrated circuit of claim 11, further comprising an n-channel pull-down transistor operably connected to the output terminal to selectively conduct between the output terminal and ground, wherein the native turn-on threshold voltage of the n-channel MOS transistor is lower than that of the n-channel pull-down transistor.

23. A CMOS integrated circuit output terminal driver comprising:
    an output terminal;
    a pull-up circuit connected to the output terminal, said pull-up circuit having
    (a) a p-channel MOS pull-up transistor and
    (b) leakage prevention means connected in series with the p-channel pull-up transistor for preventing reverse current leakage from the output terminal back through the p-channel pull-up transistor when an external high voltage is imposed upon the output terminal.

24. The output terminal driver of claim 23, wherein the leakage prevention means comprises a native n-channel MOS transistor.

25. The output terminal driver of claim 23, wherein the leakage prevention means comprises an n-channel MOS transistor having a lower threshold voltage than standard n-channel MOS transistors within the integrated circuit output driver.

26. The output terminal driver of claim 23, further comprising an n-channel MOS pull-down transistor connected to the output terminal, wherein the leakage prevention means comprises an n-channel MOS transistor having a lower turn-on threshold voltage than the n-channel MOS pull-down transistor.

* * * * *